(12) United States Patent
Kato

(10) Patent No.: US 11,868,113 B2
(45) Date of Patent: Jan. 9, 2024

(54) SERVO AMPLIFIER SYSTEM

(71) Applicant: FUJI CORPORATION, Chiryu (JP)

(72) Inventor: Naohiro Kato, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 318 days.

(21) Appl. No.: 17/431,730

(22) PCT Filed: Mar. 15, 2019

(86) PCT No.: PCT/JP2019/010737
§ 371 (c)(1),
(2) Date: Aug. 18, 2021

(87) PCT Pub. No.: WO2020/188616
PCT Pub. Date: Sep. 24, 2020

(65) Prior Publication Data
US 2022/0075350 A1    Mar. 10, 2022

(51) Int. Cl.
*G05B 19/4155* (2006.01)
(52) U.S. Cl.
CPC ............... *G05B 19/4155* (2013.01); *G05B 2219/41329* (2013.01)

(58) Field of Classification Search
CPC ...... G05B 19/4155; G05B 2219/41329; H05K 13/0406; H05K 13/0885; H05K 13/0888; H05K 13/04
See application file for complete search history.

(56) References Cited

FOREIGN PATENT DOCUMENTS

| JP | 2954616 B2 * | 9/1999 |
| JP | 2004-9168 A | 1/2004 |
| JP | 2018-46091 A | 3/2018 |
| JP | 2018-120920 A | 8/2018 |

OTHER PUBLICATIONS

International Search Report dated Jun. 18, 2019 in PCT/JP2019/010737 filed on Mar. 15, 2019 (2 pages).

* cited by examiner

*Primary Examiner* — Said Bouziane
(74) *Attorney, Agent, or Firm* — Oblon, McClelland, Maier & Neustadt, L.L.P.

(57) ABSTRACT

Provided is a servo amplifier system performing a multi-axis control for multiple axes, in which the multiple axes includes a first axis group which an axis to be locked, at the time of power supply abnormality in the multi-axis control, belongs to, and a second axis group which an axis to be subjected to servo-off belongs to, the servo-off being made before the axis belonging to the first axis group is locked at the time of the power supply abnormality.

4 Claims, 3 Drawing Sheets

SERVO AMPLIFIER SYSTEM

TECHNICAL FIELD

The present disclosure relates to a servo amplifier system performing a multi-axis control.

BACKGROUND ART

Conventionally, various techniques have been proposed for a servo amplifier system performing a multi-axis control. For example, the technique disclosed in Patent Literature 1 is a control device for controlling a mechanical apparatus including a gravity axis, a motor that drives the gravity axis, and a brake device that brakes the gravity axis, the control device including a servo amplifier that is connected to the motor of the mechanical apparatus and controls the motor, a brake circuit that is connected to the brake device of the mechanical apparatus and controls the brake device, a main control section that is connected to the servo amplifier and connected to the brake circuit, supplies a drive signal and a power shutoff signal for controlling the motor to the servo amplifier by the servo amplifier, and supplies a brake effective signal for controlling the brake device to the brake circuit by the brake circuit, a control power supply that supplies a power shutoff command signal, for supplying the power shutoff signal to the servo amplifier, to the main control section by the main control section, and directly supplies the brake effective signal to the brake circuit, and a delay circuit that is interposed between the control power supply and the main control section to delay a timing at which the power shutoff command signal is supplied to the main control section, in which the brake circuit immediately controls the brake device based on the brake effective signal from the control power supply to brake the gravity axis by the brake device.

PATENT LITERATURE

Patent Literature 1: JP-A-2004-9168

BRIEF SUMMARY

Technical Problem

According to the disclosure of Patent Literature 1, a control device having such a characteristic can prevent the gravity axis from spontaneously falling when a power supply is turned off, but a more preferable measure has been demanded.

The present disclosure has been made in view of the above-described problems, and an object of the present disclosure is to provide a servo amplifier system in which measures are preferably taken at the time of power supply abnormality in a multi-axis control.

Solution to Problem

The present specification discloses a servo amplifier system performing a multi-axis control for multiple axes, in which the multiple axes includes a first axis group which an axis to be locked, at the time of power supply abnormality in the multi-axis control, belongs to, and a second axis group which an axis to be subjected to servo-off belongs to, the servo-off being made before the axis belonging to the first axis group is locked at the time of the power supply abnormality.

Advantageous Effects

According to the present disclosure, the servo amplifier system is preferably provided with the measures at the time of the power supply abnormality in a multi-axis control.

DESCRIPTION OF EMBODIMENTS

Figure 1:
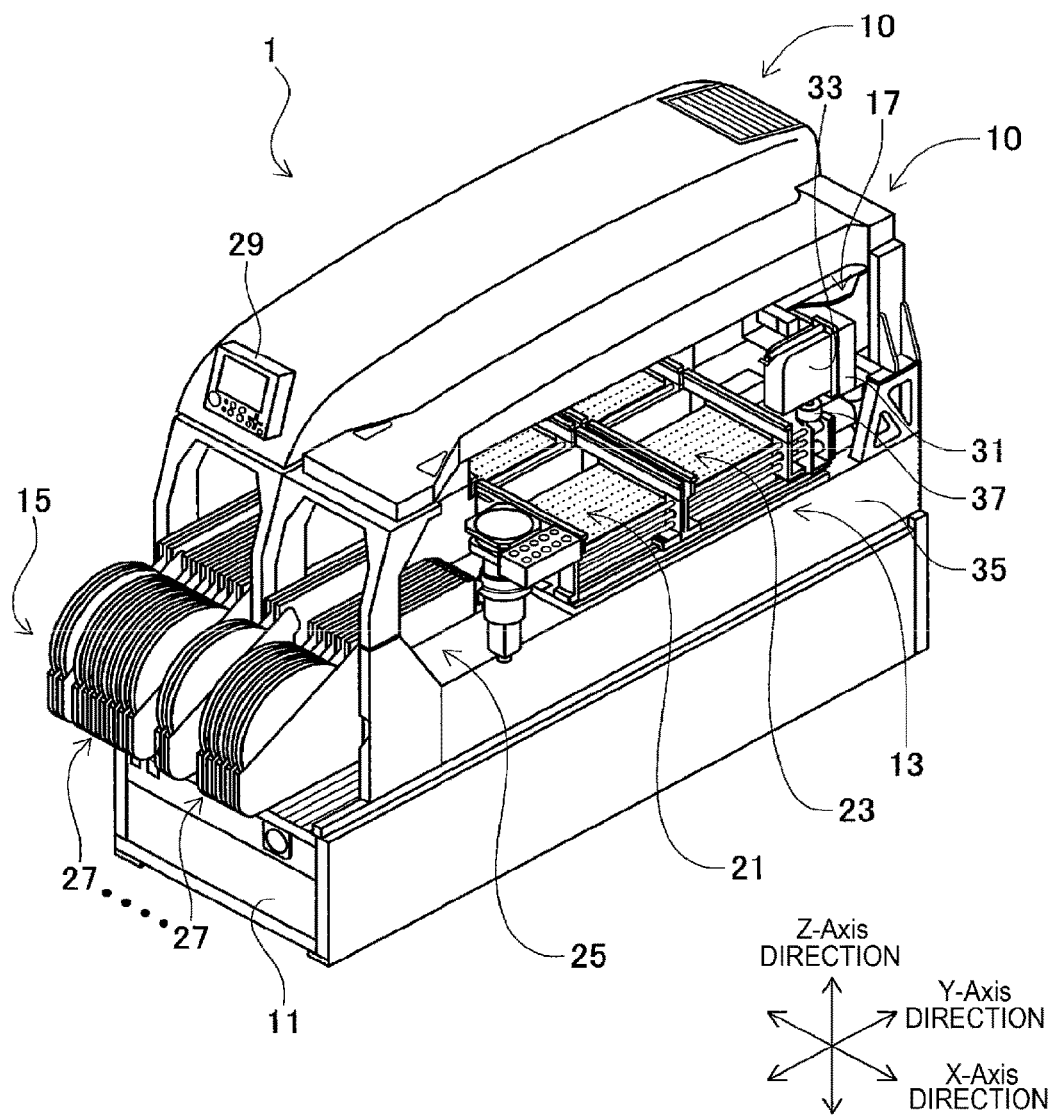
FIG. 1 is a perspective view of a component mounter constituting the servo amplifier system of the present embodiment.

Hereinafter, an embodiment embodying the present disclosure will be described with reference to the accompanying drawings. As shown in FIG. 1, servo amplifier system 1 of the present embodiment includes component mounter 10. FIG. 1 shows two component mounters 10 arranged in parallel on a common base 11. Component mounter 10 is, for example, is a device which is connected to other devices such as a solder printing machine, a board inspection machine, and a reflow machine to constitute a production line, thereby producing a circuit board on which multiple electronic components are mounted. Since two component mounters 10 have the same configuration, one of them will be mainly described. In component mounter 10, various devices such as board conveyance device 13, component supply device 15, and head driving mechanism 17 are attached on common base 11. In the following description, as shown in FIG. 1, a direction in which component mounter 10 are arranged in parallel is referred to as an X-axis direction, a direction parallel to a board plane of a circuit board to be conveyed and perpendicular to the X-axis direction is referred to as a Y-axis direction, and a direction perpendicular to both the X-axis direction and the Y-axis direction is referred to as the Z-axis direction.

Board conveyance device 13 is a so-called double conveyor type device in which first conveyance device 21 and second conveyance device 23 are arranged in parallel in the Y-axis direction. Each of first conveyance device 21 and second conveyance device 23 has a pair of conveyor belts (not shown) disposed along the X-axis direction. Each of first conveyance device 21 and second conveyance device 23 circulates a pair of conveyor belts to convey a circuit board supported on the conveyor belts in the X-axis direction. In addition, each of first conveyance device 21 and second conveyance device 23 holds and fixes a circuit board, conveyed to a stop position where a mounting work of electronic components is performed, by a stopper (not shown) provided at the upper portion of the circuit board and a clamper (not shown) provided at the lower portion of the circuit board, in the Z-axis direction. For example, each of first conveyance device 21 and second conveyance device 23 conveys a circuit board conveyed from an upstream device such as a solder printing machine in the X-axis direction, and clamps the circuit board at the stop position. When the mounting work is ended, first conveyance device 21 and second conveyance device 23 convey the circuit board in the X-axis direction and convey the circuit board out to a device at a later stage.

component supply device 15 is a feeder type device and is provided at a front end portion (lower left side in FIG. 1) of component mounter 10 in the Y-axis direction. In component supply device 15, multiple feeders 25 arranged in parallel in the X-axis direction are provided on common base 11. Each feeder 25 is configured to be detachable from common base 11, and supplies electronic components from tape feeder 27 to a supply position. Tape feeder 27 is a medium for supplying the electronic components and is wound with a carrier tape which holds multiple electronic components at constant intervals. In feeder 25, a distal end of the carrier tape is pulled out to the supply position, and different types of electronic components are supplied for each of carrier tapes. The supply position of each feeder 25 is arranged in parallel along the X-axis direction. Therefore, the supply position is different in the X-axis direction for different types of electronic components.

In addition, head driving mechanism 17 is an XY-robot type moving device. Head driving mechanism 17 includes X-axis servo motor 41 (refer to FIG. 2) that slides slider 31 in the X-axis direction, and Y-axis servo motor 43 (refer to FIG. 2) that slides in the Y-axis direction. Mounting head 33 is attached to slider 31. Mounting head 33 moves to a random position on each frame portion 35 of component mounter 10 placed on common base 11 by driving two servo motors 41 and 43. X-axis servo motor 41 and Y-axis servo motor 43 can use, for example, a linear motor mechanism or a ball screw feed mechanism as a moving mechanism. A movement distance of mounting head 33 is longer in the Y-axis direction than in the X-axis direction. Due to such a movement distance or the like, the power consumption of Y-axis servo motor 43 is larger than the power consumption of X-axis servo motor 41.

Nozzle holder 37 is provided below mounting head 33. Nozzle holder 37 holds multiple mounting nozzles downward. Each of the mounting nozzles communicates with a negative pressure air passage and a positive pressure air passage via a positive and negative pressure supply device (not shown), picks up and holds an electronic component by the negative pressure, and separates the held electronic component by being supplied with a slight positive pressure. Mounting head 33 has R-axis servo motor 45 (refer to FIG. 2) that rotationally drives nozzle holder 37 around the Z-axis. In addition, mounting head 33 has Z-axis servo motor 47 (refer to FIG. 2) that individually extends the selected mounting nozzle downward in the Z-axis direction and retracts upward in the Z-axis direction. In addition, mounting head 33 has Q-axis servo motor 49 (refer to FIG. 2) that rotationally drives the selected mounting nozzle around the Z-axis individually.

Board conveyance device 13, component supply device 15, head driving mechanism 17, and mounting head 33 described above are connected to control device 51 (refer to FIG. 2) by a communication cable. Control device 51 acquires various information from each of devices 13 to 17, and executes arithmetic, a determination, and the like based on the acquired information. In addition, control device 51 appropriately controls the operations of devices 13 to 17 based on an arithmetic result and a determination result. In component mounter 10, the mounting work of electronic components is controlled by control device 51. Further, in component mounter 10, operation device 29 is provided at a front end portion of an upper cover. The operator can confirm the information output to operation device 29 by control device 51, and perform necessary operations and settings on operation device 29.

Figure 3:
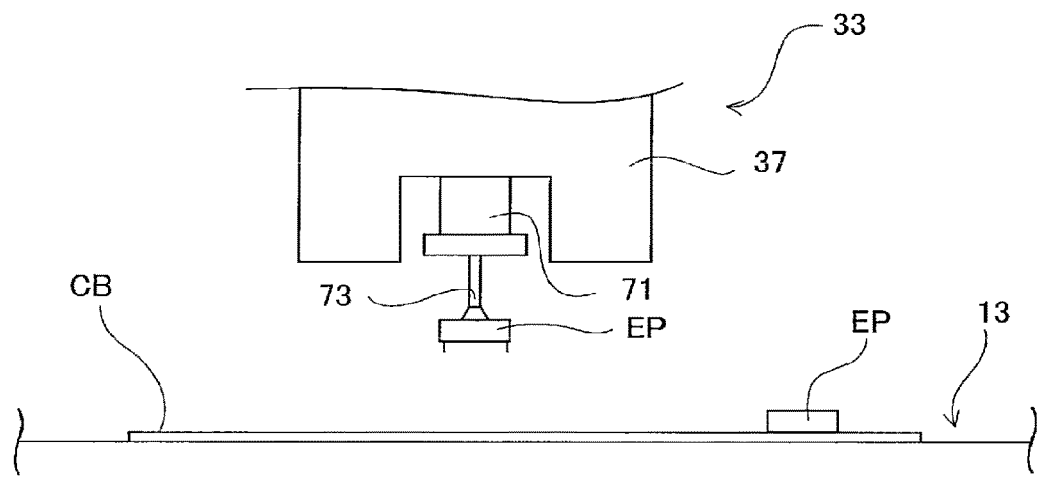
FIG. 3 is a view schematically showing a part of a mounting head.

Component mounter 10 having the above-described configuration repeatedly executes the mounting work of mounting the electronic component at the supply position to the mounting position of the circuit board by driving head driving mechanism 17 and mounting head 33 based on the control of control device 51. Specifically, first, head driving mechanism 17 moves mounting head 33 to a position above the supply position of feeder 25 to which an electronic component to be mounted is supplied. Mounting head 33 picks up the electronic component at the supply position by the mounting nozzle. Next, head driving mechanism 17 moves mounting head 33 to a position above the circuit board which is positioned at the stop position by board conveyance device 13. Then, in mounting head 33, Z-axis servo motor 47 is driven to extend the mounting nozzle downward in the Z-axis direction. At this time, as shown in FIG. 3, in nozzle holder 37 of mounting head 33, lifting and lowering shaft 71 lowers in a state in which electronic component EP is picked up by mounting nozzle 73 provided at the lower end thereof. Further, in mounting head 33, when electronic component EP abuts the mounting position of circuit board CB on board conveyance device 13, the negative pressure of mounting nozzle 73 is released, so that electronic component EP is separated and mounted on circuit board CB.

Figure 2:
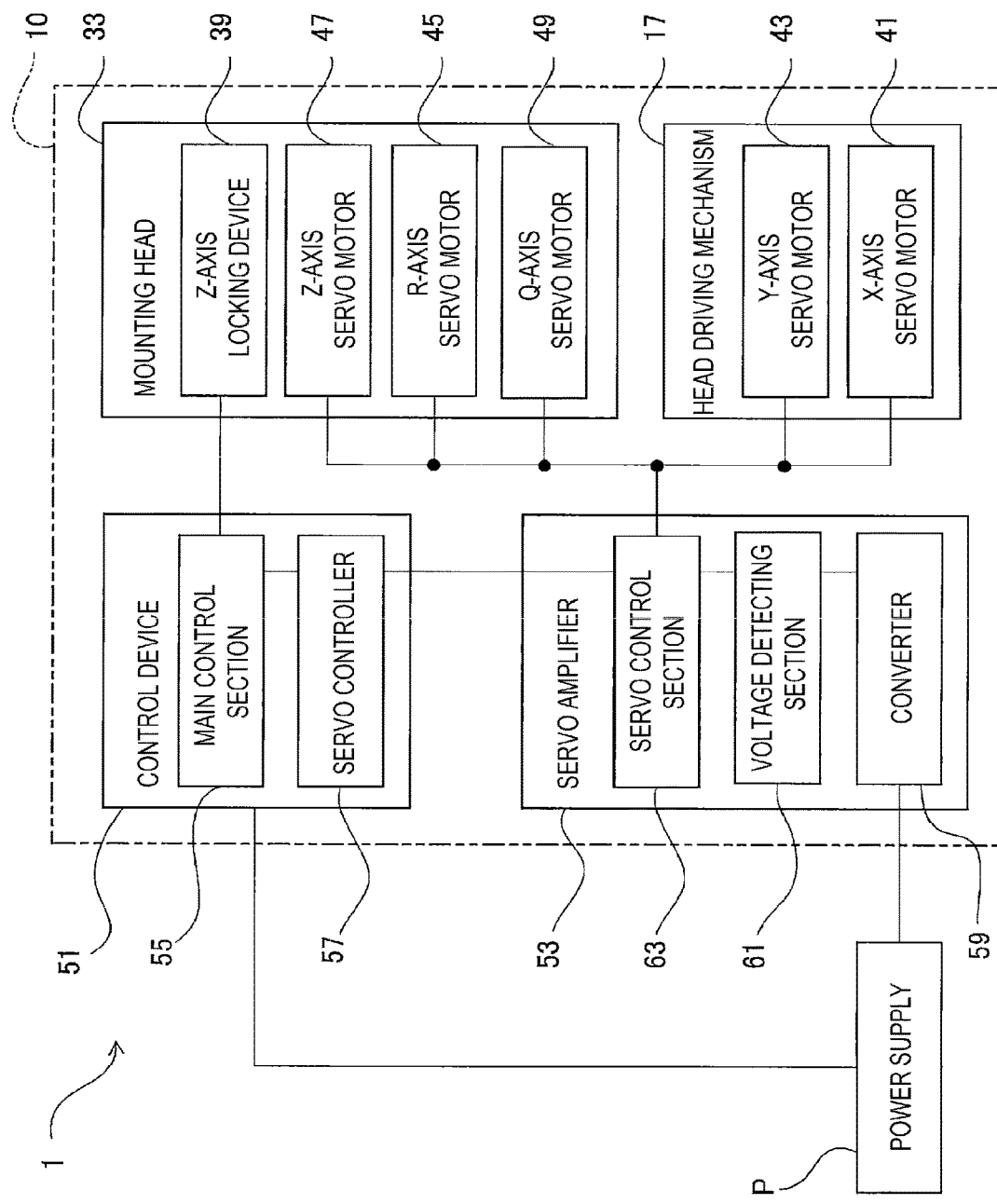
FIG. 2 is a view for explaining a control configuration of the servo amplifier system.

As shown in FIG. 2, component mounter 10 includes servo amplifier 53 in addition to the above-described configuration, and further includes main control section 55 and servo controller 57 in control device 51. Main control section 55 is configured to be mainly a computer, and includes an arithmetic circuit such as a CPU, a memory device such as a RAM and a ROM, and controls entire component mounter 10.

Servo controller 57 is connected to main control section 55 in control device 51 and is connected to servo amplifier 53 by a communication cable. Servo controller 57 constitutes a servo mechanism by servo motors 41 and 43 of head driving mechanism 17 and servo motors 45 to 49 of mounting head 33 described above, in addition to main control section 55 and servo amplifier 53. As a result, the mounting work of the electronic component EP described above is performed by performing the multi-axis control.

Servo amplifier 53 includes converter 59, voltage detecting section 61, and servo control section 63. Converter 59 rectifies an alternating current of connected power supply P, smooths the rectified alternating current with a capacitor, and converts the rectified alternating current into a direct current. Power supply P is, for example, a commercial power supply, and is also connected to control device 51 to supply power to the above-described multi-axis control.

Voltage detecting section 61 is connected to converter 59 and servo control section 63 in servo amplifier 53. Voltage detecting section 61 transmits a warning signal to servo control section 63 when the voltage of converter 59 decreases and becomes smaller than a reference value (for example, a value below the commercial power supply voltage). When servo control section 63 receives the warning signal, it notifies main control section 55 of the fact via servo controller 57.

Servo control section 63 is connected to each of servo motors 41 and 43 of head driving mechanism 17 and each of servo motors 45 to 49 of mounting head 33 by a communication cable. Servo control section 63 sets each of servo motors 41 and 43 of head driving mechanism 17 and each of servo motors 45 to 49 of mounting head 33 in a servo-on state or a servo-off state in accordance with a command from servo controller 57. Accordingly, servo amplifier 53 including above servo control section 63 is of a multi-axial integral type.

Mounting head 33 further includes Z-axis locking device 39. Z-axis locking device 39 is configured to automatically lock lifting and lowering shaft 71 by shutting off the power supply so as to disable the up-down movement in the Z-axis direction. In addition, Z-axis locking device 39 is connected to main control section 55 by a communication cable. As a result, for example, by transmitting a low-level signal to Z-axis locking device 39, main control section 55 can automatically lock lifting and lowering shaft 71 so as to disable the up-down movement in the Z-axis direction in the same manner as when the power supply is shut off. Since above Z-axis locking device 39 is configured by a well-known technique, a detailed description thereof will be omitted.

Figure 4:
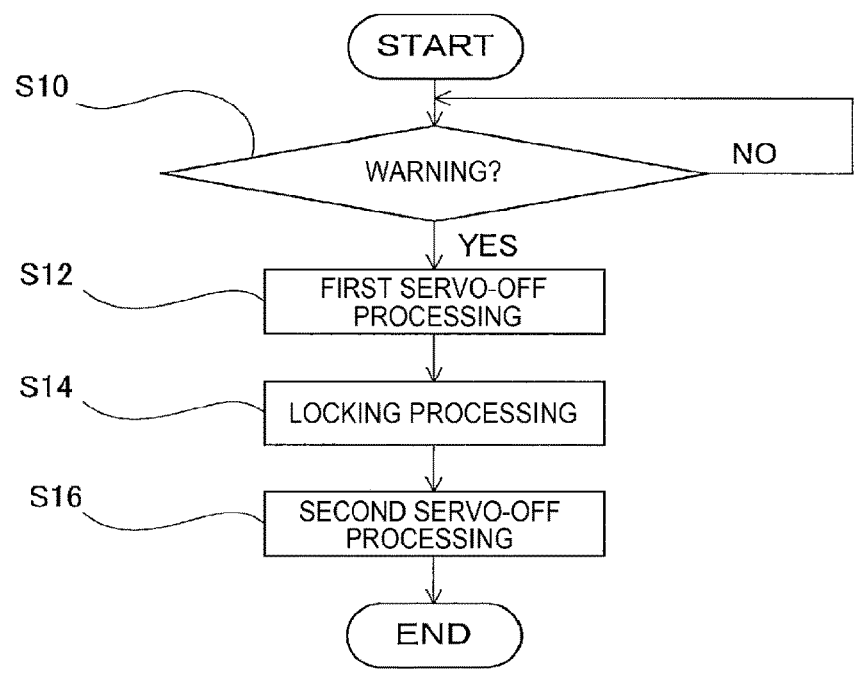
FIG. 4 is a flowchart for explaining a function of the servo amplifier system.

In servo amplifier system 1 of the present embodiment, lifting and lowering shaft 71 is prevented from falling by its own weight at the time of power supply abnormality in the multi-axis control as described above. Accordingly, each processing shown in the flowchart in FIG. 4 is executed by, for example, a servo middleware operating in main control section 55.

Examples of the power supply abnormality include a case where power supply P fails to power. In such a case, main control section 55 continues the operation of the servo middleware by, for example, electric power charged in the capacitor. In addition, the operation of servo amplifier 53 is performed by the electric power charged in the capacitor in converter 59.

First, in step S10, main control section 55 determines whether a notification indicating that servo control section 63 has received the warning signal of voltage detecting section 61 is received from servo controller 57. This determination is performed again in a case where main control section 55 has not received the notification described above (S10: NO).

On the other hand, in a case where main control section 55 receives the notification described above (S10: YES), the first servo-off processing is performed in step S12. In this processing, main control section 55 sets each of servo motors 41 and 43 of head driving mechanism 17 in the servo-off state via servo controller 57 and servo control section 63. At this time, servo motors 41 and 43 of head driving mechanism 17 are placed in the servo-off state in the descending order of power consumption. Accordingly, Y-axis servo motor 43 is placed in the servo-off state, and then X-axis servo motor 41 is placed in the servo-off state. As a result, the servo-on state of Z-axis servo motor 47 is maintained by an electric power obtained by adding a regenerative energy returned to the capacitor in converter 59 until each of servo motors 41 and 43 stops.

Subsequently, in step S14, locking processing is performed. In this processing, main control section 55 locks lifting and lowering shaft 71 via Z-axis locking device 39.

Further, in step S16, the second servo-off processing is performed. In this processing, after a lapse of time required to complete the locking of Z-axis locking device 39, main control section 55 sets each of servo motors 45, 47, and 49 of mounting head 33 in the servo-off state via servo controller 57 and servo control section 63.

As described in detail above, servo amplifier system 1 of the present embodiment is preferably provided with measures at the time of the power supply abnormality in the multi-axis control.

In the present embodiment, component mounter 10 is an example of a mounter. An axis group including X-axis servo motor 41 and Y-axis servo motor 43 is an example of the second axis group. An axis group including Z-axis servo motor 47 is an example of the first axis group. Voltage detecting section 61 is an example of a detecting section.

The present disclosure is not limited to the above-described embodiment, and various modifications can be made within the scope not departing from the concept of the present disclosure. For example, in the first servo-off processing (S12) or the second servo-off processing (S16), servo control section 63 may place each of servo motors 41 to 49 in the servo-off state instead of main control section 55.

In addition, in a configuration in which a signal is input and output between servo amplifier 53 and Z-axis locking device 39, at the timing when servo control section 63 receives the warning signal, the signal output from servo amplifier 53 and input to Z-axis locking device 39 may be treated as a trigger, whereby locking of lifting and lowering shaft 71 in locking processing (S14) may be started.

In addition, by providing voltage detecting section 61 between power supply P and servo amplifier 53, the warning signal of voltage detecting section 61 may be input to servo controller 57.

Further, servo amplifier 53 may be configured by a combination of a multi-axial integral type and a one-axial type, or may be configured by five one-axial types. However, in such a case, voltage detecting section 61 is provided in a servo amplifier for controlling Y-axis servo motor 43 or X-axis servo motor 41, or is provided between a servo amplifier for controlling Y-axis servo motor 43 or X-axis servo motor 41 and power supply P.

In addition, the present disclosure may be embodied by a machine tool or the like.

REFERENCE SIGNS LIST

1: servo amplifier system, 10: component mounter, 41: X-axis servo motor, 43: Y-axis servo motor, 45: R-axis servo motor, 47: Z-axis servo motor, 49: Q-axis servo motor, 61: voltage detecting section, CB: circuit board, EP: electronic component

The invention claimed is:

1. A servo amplifier system performing a multi-axis control for multiple axes, wherein
the multiple axes include:
a first axis group which an axis to be locked, at the time of power supply abnormality in the multi-axis control, belongs to, and
a second axis group which an axis to be subjected to servo-off belongs to, the servo-off being made before the axis belonging to the first axis group is locked at the time of the power supply abnormality.

2. The servo amplifier system according to claim 1, comprising:
a detecting section configured to detect the power supply abnormality for power supplied to the second axis group.

3. The servo amplifier system according to claim 1, wherein
at least two or more axes belong to the second axis group, and the axes are turned servo-off in descending order of power consumption.

4. The servo amplifier system according to claim 3, wherein
  the multiple axes include an X-axis, a Y-axis, and a Z-axis operating in a gravity direction of a mounter for mounting an electronic component on a circuit board,
  the Z-axis is included in the first axis group, and
  the X-axis and the Y-axis are included in the second axis group.

\* \* \* \* \*